United States Patent
Kim

(10) Patent No.: US 8,193,851 B2
(45) Date of Patent: Jun. 5, 2012

(54) FUSE CIRCUIT OF SEMICONDUCTOR DEVICE AND METHOD FOR MONITORING FUSE STATE THEREOF

(75) Inventor: Seung-Lo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 80 days.

(21) Appl. No.: 12/494,520

(22) Filed: Jun. 30, 2009

(65) Prior Publication Data

US 2010/0295605 A1 Nov. 25, 2010

(30) Foreign Application Priority Data

May 19, 2009 (KR) .................. 10-2009-0043554

(51) Int. Cl.
*H01H 37/76* (2006.01)
*H01H 85/00* (2006.01)
(52) U.S. Cl. ........................................................ 327/525
(58) Field of Classification Search .......... 327/525–526; 365/225.7
See application file for complete search history.

(56) References Cited

U.S. PATENT DOCUMENTS

| 6,949,986 B2 * | 9/2005 | Tsujino et al. ............. 333/124 |
| 7,116,590 B2 * | 10/2006 | Blodgett ................. 365/200 |
| 7,688,659 B2 * | 3/2010 | Mori et al. .............. 365/201 |
| 2006/0098504 A1 * | 5/2006 | Takita ................... 365/200 |
| 2006/0125548 A1 * | 6/2006 | Kitayama et al. ......... 327/525 |
| 2008/0144410 A1 | 6/2008 | Koshikawa et al. |

FOREIGN PATENT DOCUMENTS

KR 1020040093897 11/2004

OTHER PUBLICATIONS

Notice of Preliminary Rejection issued from Korean Intellectual Property Office on Dec. 6, 2010.

* cited by examiner

*Primary Examiner* — Quan Tra
(74) *Attorney, Agent, or Firm* — IP & T Group LLP

(57) ABSTRACT

A fuse circuit of a semiconductor device includes a plurality of fuse set units configured to compare an input address with address information programmed according to a fuse cutting state and a test control unit configured to enable one or more fuse set units selected based on a number of times that a selection signal is enabled in a test mode.

5 Claims, 8 Drawing Sheets

FUSE CIRCUIT OF SEMICONDUCTOR DEVICE AND METHOD FOR MONITORING FUSE STATE THEREOF

CROSS-REFERENCE TO RELATED APPLICATIONS

The present application claims priority of Korean Patent Application No. 10-2009-0043554, filed on May 19, 2009, the disclosure of which is incorporated herein by reference in its entirety.

BACKGROUND OF THE INVENTION

The present invention relates to a semiconductor design technology, and more particularly, to a technology for monitoring a state of a specific fuse.

Semiconductor devices and semiconductor memory devices may include a fuse circuit for changing an internal setup or programming a repair address. A fuse included in a fuse circuit stores an address and specific setup information through a fuse programming. When a laser beam or electrical stress is applied to a fuse, an electrical connection characteristic of the fuse is changed and therefore an electrical resistance is changed. Specific information is programmed using the change of an electric connection state, that is, a short state or an open state.

A laser blowing type fuse whose connection state is cut using a laser beam is generally called a physical fuse type and is used in a wafer level that is prior to fabrication of a semiconductor device into a package. In a package level, an electrical method is used, instead of a physical method using a laser beam. A fuse programmable in a package level is generally called an electrical fuse. The electrical fuse is programmed by changing an electrical connection state through application of an electrical stress. The electrical fuse may be classified into an anti-type fuse (hereinafter, referred to as an antifuse) changing an open state to a short state, and a blowing-type fuse changing a short state to an open state. Various types of fuses are selectively used, considering characteristics or area of semiconductor device and semiconductor memory devices.

Generally, a fuse circuit includes a plurality of fuse set units. In the case of a fuse circuit for programming an address, a specific address can be programmed in each fuse set. That is, the fuse circuit stores addresses corresponding to electrical connection states of a plurality of address fuses included in the fuse sets. A basic unit for storing one address is referred to as a fuse set unit.

FIG. 1 is a block diagram of a typical fuse set unit.

Referring to FIG. 1, a fuse set unit includes an enable fuse unit 101, an address fuse unit 102, and a signal combination unit 103. The address fuse unit 102 compares address information programmed in a plurality of address fuses with address bit signals of input addresses ADDR<0:N> and outputs a plurality of comparison result signals HIT<0:N>. The signal combination unit 103 combines the comparison result signals HIT<0:N> under the control of the enable fuse unit 101 and outputs a combination signal HITB. The enable fuse unit 101 outputs an enable signal ENABLE corresponding to an electrical connection state of an enable fuse. The enable signal ENABLE is used to control the signal combination unit 103. That is, when the enable fuse is cut, the enable signal ENABLE is activated and the signal combination unit 103 combines the comparison result signals HIT<0:N> of the address fuse unit 102 to output the combination signal HITB.

FIG. 2 is a circuit diagram of the enable fuse unit 101 of FIG. 1.

Referring to FIG. 2, the enable fuse unit 101 includes a PMOS transistor MP1, a fuse, a first NMOS transistor MN1, a first inverter INV1, a second NMOS transistor MN2, a NOR gate NOR1, and a second inverter INV2. The PMOS transistor MP1 is connected between a power supply voltage terminal VDD and a first node N1 and is controlled by a power-up signal PWRUP. The fuse is connected between the first node N1 and a second node N2. The first NMOS transistor MN1 is connected between a ground voltage terminal VSS and the second node N2 and is controlled by the power-up signal PWRUP. The first inverter INV1 receives a signal of the second node N2. The second NMOS transistor MN2 is connected between the second node N2 and the ground voltage terminal VSS and is controlled by an output signal of the first inverter INV1. The NOR gate NOR1 receives a test mode signal TEST_MODE and the output signal of the first inverter INV1. The second inverter INV2 receives an output signal of the NOR gate NOR1 to output the enable signal ENABLE.

An operation of the enable fuse unit will be described below.

The power-up signal PWRUP changes to a low level when an external power supply voltage is stabilized, and the test mode signal TEST_MODE maintains a high level when a test mode is enabled.

In a normal mode where the test mode signal TEST_MODE maintains a low level, the NOR gate NOR1 inverts the output signal of the first inverter INV1. The second inverter INV2 inverts the output signal of the NOR gate NOR1 and outputs the inverted signal as the enable signal ENABLE. If the fuse is not cut, the first PMOS transistor MP1 is turned on in response to the power-up signal PWRUP and thus the voltage level of the second node N2 increases. As a result, the enable signal ENABLE of a low level is outputted. If the fuse is cut, the voltage level of the second node N2 becomes an initial low level and is kept at the low level by a latch implemented with the second NMOS transistor MN2 and the first inverter INV1.

As a result, the enable signal ENABLE is activated to a high level. That is, when the fuse is cut in the normal mode, the enable signal ENABLE is activated to a high level.

Meanwhile, in a test mode where the test mode signal TEST_MODE is at a high level, the NOR gate NOR1 outputs a low level, without regard to the output signal of the first inverter INV1 and thus the enable signal ENABLE of a high level is outputted. That is, in the test mode, the enable signal ENABLE is activated to a high level, without regard to the cutting of the fuse.

FIG. 3 is a block diagram of a conventional fuse circuit of a semiconductor device.

Referring to FIG. 3, the conventional fuse circuit includes a plurality of fuse set units 301 to 306 for comparing input addresses ADDR<0:N> with address information programmed according to fuse cutting states.

When the test mode signal TEST_MODE is activated to a high level and thus the semiconductor device operates in a test mode, the fuse set units 301 to 306 are simultaneously enabled in response to the test mode signal TEST_MODE. In the test mode, it is detected whether the address fuses included in the fuse set units 301 to 306 are defective. In the conventional fuse circuit, the fuse set units 301 to 306 are simultaneously enabled when the test mode signal TEST_MODE is activated, and the defective address fuses are detected by comparing the programmed addresses with the input addresses ADDR<0:N>.

In this way, since the fuse set units are simultaneously enabled in the test mode, the conventional fuse circuit can detect whether the defective address fuse exists in the fuse set units 301 to 306 as a whole. However, the conventional fuse circuit cannot detect a fuse set unit individually where a defective address fuse exists. Moreover, the conventional fuse circuit cannot detect which address fuse is defective in the corresponding fuse set unit.

SUMMARY OF THE INVENTION

An embodiment of the present invention is directed to providing a fuse circuit of a semiconductor device, which is capable of detecting a fuse set unit where a defective fuse exists, and confirming a position of a defective fuse of a corresponding fuse set unit.

Another embodiment of the present invention is directed to providing a method for monitoring a fuse state, which is capable of detecting a position of a defective fuse.

In accordance with an aspect of the present invention, there is provided a fuse circuit of a semiconductor device. The fuse circuit includes a plurality of fuse set units configured to compare an input address with address information programmed according to a fuse cutting state, and a test control unit configured to enable one or more fuse set units selected based on a number of times that a selection signal is enabled in a test mode.

In accordance with another aspect of the present invention, there is provided a fuse circuit of a semiconductor device, including: a plurality of fuse set units configured to compare an input address with address information programmed according to a fuse cutting state; and a shift register unit configured to sequentially enable the plurality of fuse set units in response to the selection signal in the test mode.

In accordance with another aspect of the present invention, there is provided a fuse circuit of a semiconductor device including: a plurality of fuse set groups including a predetermined number of fuse set units and configured to compare an input address with address information programmed according to a fuse cutting state; and a shift register unit configured to sequentially enable the plurality of fuse set groups in response to a selection signal in a test mode.

In accordance with another aspect of the present invention, there is provided a method for monitoring a fuse state of a plurality of fuse set units configured to compare an input address with address information programmed according to a fuse cutting state. The method includes enabling a first fuse set unit of the fuse set units during a first activation period of a selection signal, sequentially inputting a test address to the enabled first fuse set unit to compare programmed first address information with the test address, the programmed first address information being an initial value when the fuse cutting is not performed, enabling a second fuse set unit of the fuse set units during a second activation period of the selection signal, and sequentially inputting the test address to the enabled second fuse set units to compare programmed second address information with the test address, the programmed second address information being an initial value when the fuse cutting is not performed.

In the test mode, the plurality of fuse set units is selectively enabled. The test address is sequentially inputted to the enabled fuse set unit and compared with initial address information programmed in the fuse set unit. When the initial address information programmed in a plurality of address fuses of the fuse set unit is not a predefined initial value, it is determined that a specific address fuse is defective. The position of the defective fuse can be detected through the comparison with the test address.

DESCRIPTION OF SPECIFIC EMBODIMENTS

Figure 1:
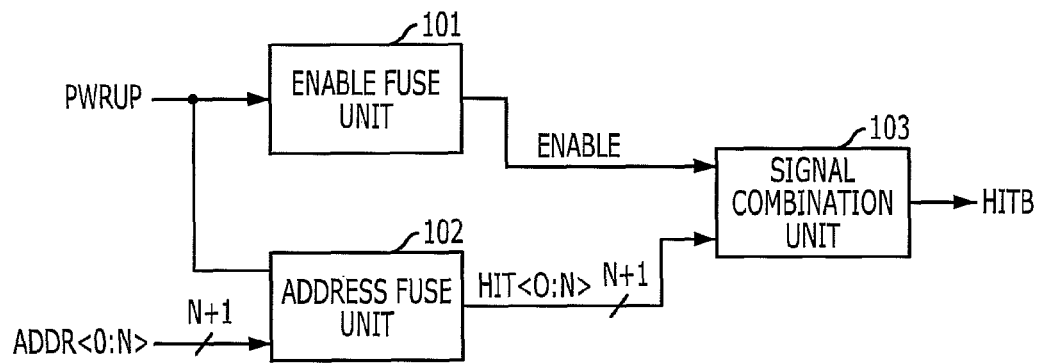
FIG. 1 is a block diagram of a typical fuse set unit.
Figure 2:
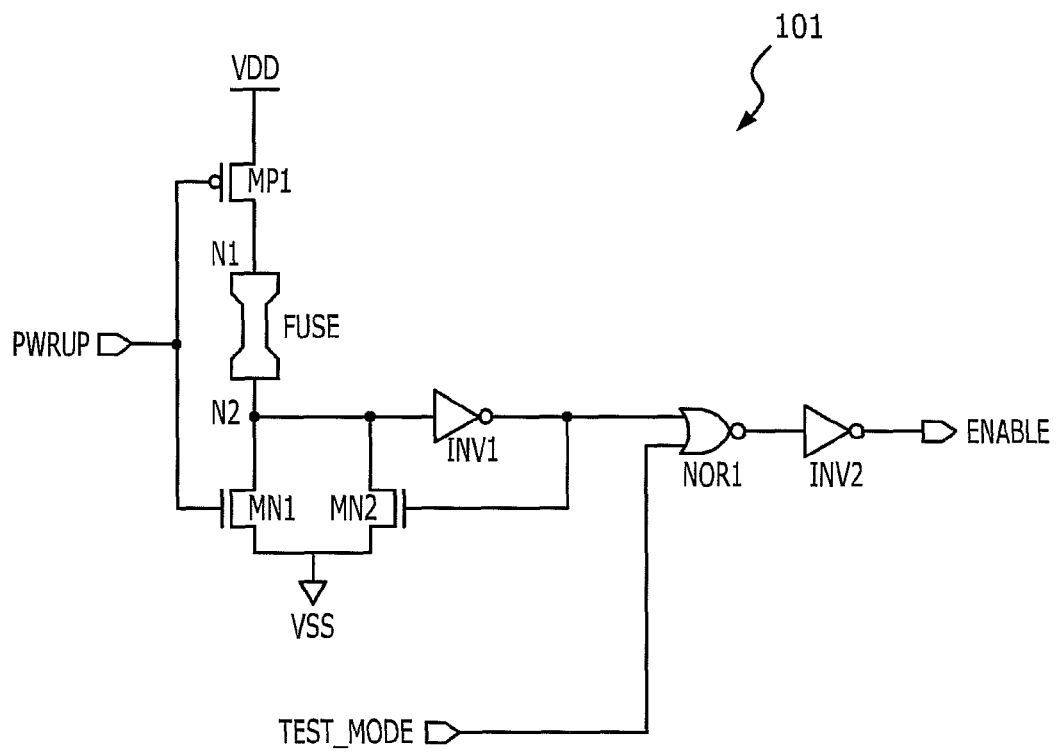
FIG. 2 is a circuit diagram of an enable fuse unit of FIG. 1.
Figure 3:
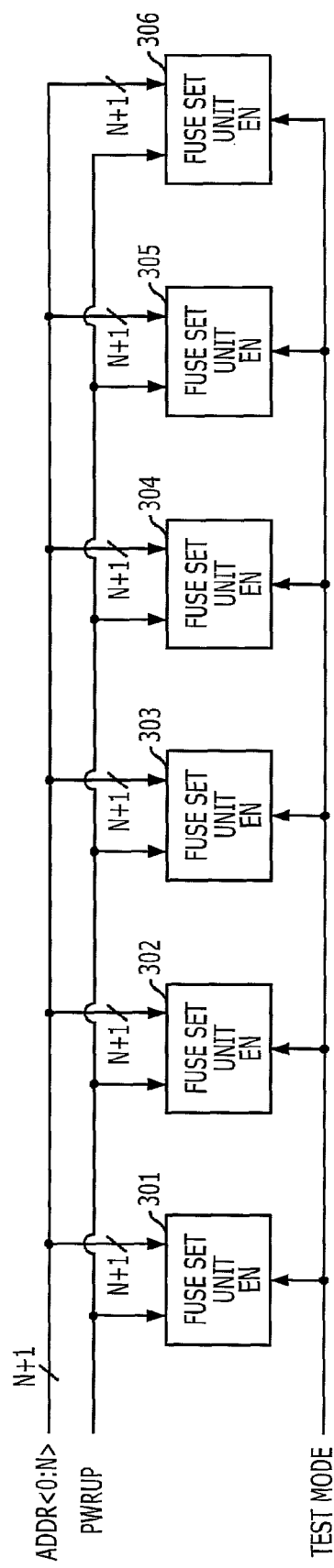
FIG. 3 is a block diagram of a conventional fuse circuit of a semiconductor device.

Other objects and advantages of the present invention can be understood by the following description, and become apparent with reference to the embodiments of the present invention. In the drawings and detailed description, since the terms, numerals, and symbols used to indicate devices or blocks may be expressed by sub-units, it should be noted that the same terms, numerals, and symbols may not indicate the same devices in a whole circuit.

Generally, logic signals of a circuit have a high level (H) and a low level (L) according to a voltage level and may be represented by a logical state "1" and a logical "0," respectively. It will be assumed that, if necessary, the logic signals may have a high impedance (Hi-Z) state. Furthermore, the terms p-channel metal oxide semiconductor (PMOS) and n-channel metal oxide semiconductor (NMOS) used herein are a type of metal oxide semiconductor field effect transistor (MOSFET).

Figure 4:
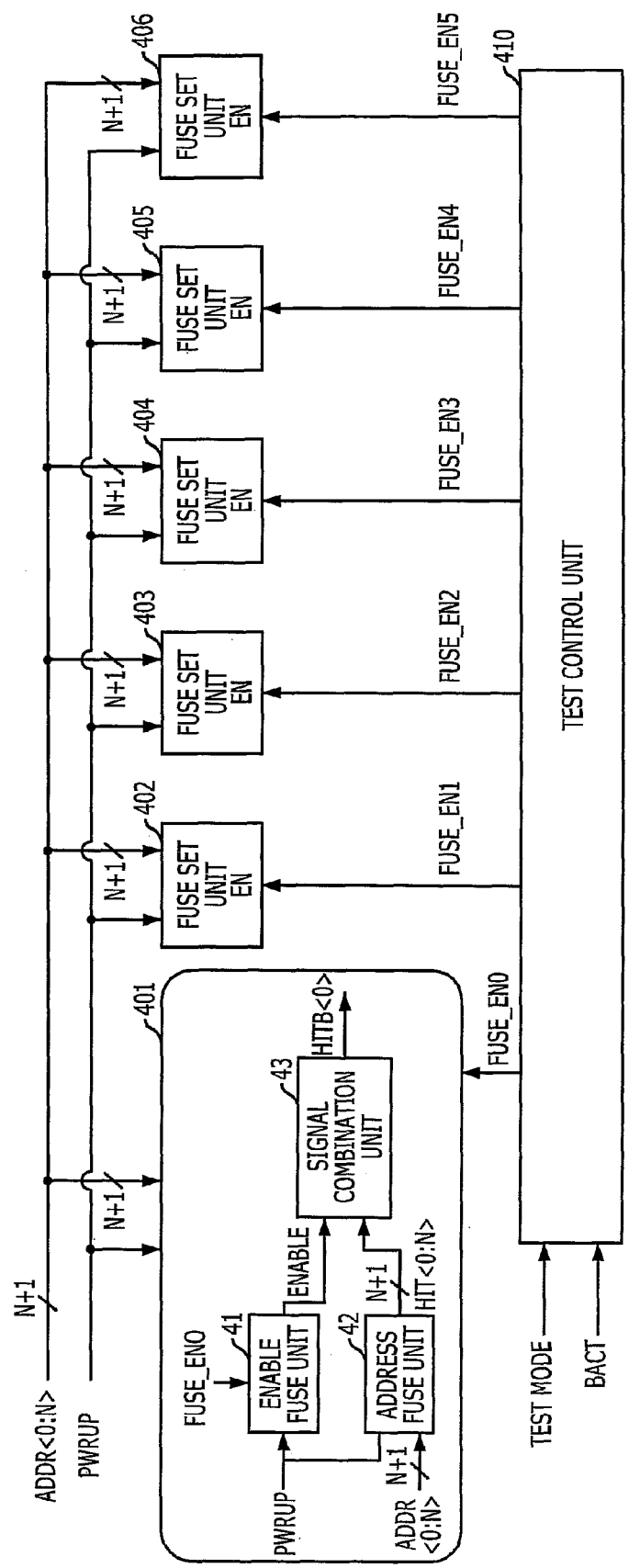
FIG. 4 is a block diagram of a fuse circuit of a semiconductor device in accordance with a first embodiment of the present invention.

FIG. 4 is a block diagram of a fuse circuit of a semiconductor device in accordance with a first embodiment of the present invention.

Referring to FIG. 4, the fuse circuit of the semiconductor device includes a plurality of fuse set units 401 to 406, and a test control unit 410. The fuse set units 401 to 406 compare input addresses ADDR<0:N> with address information programmed according to fuse cutting states. The test control unit 410 enables one or more fuse set units selected according to the number of activation of a selection signal BACT in a test mode.

A detailed structure and operation of the fuse circuit of FIG. 4 will be described below.

The fuse set units 401 to 406 can program address information through a fuse cutting process. Each of the fuse set units 401 to 406 includes an enable fuse unit 41, an address fuse unit 42, and a signal combination unit 43. The address fuse unit 42 compares address information programmed in a plurality of address fuses with address bit signals of input addresses ADDR<0:N> and outputs a plurality of comparison result signals HIT<0:N>. The signal combination unit 43 combines the comparison result signals HIT<0:N> under the control of the enable fuse unit 41 and outputs a combination signal HITB<0>. The enable fuse unit 41 outputs an enable signal ENABLE corresponding to an electrical connection state of an enable fuse. The enable signal ENABLE is used to control the signal combination unit 43. That is, when the enable fuse is cut, the enable signal ENABLE is activated and the signal combination unit 43 combines the comparison result signals HIT<0:N> of the address fuse unit 42 to output the combination signal HITB<0>.

The test control unit 410 sequentially enables the fuse set units 401 to 406 in the test mode. The enabling order of the fuse set units 401 to 406 is determined in such a way to match different fuse set units to different activation periods of the selection signal BACT. That is, since a first fuse set enable signal FUSE_EN0 of the test control unit 410 is activated in a first activation period of the selection signal BACT, the first fuse set unit 401 controlled by the first fuse set enable signal FUSE_EN0 is enabled. Then, since a second fuse set enable signal FUSE_EN1 of the test control unit 410 is activated in a second activation period of the selection signal BACT, the second fuse set unit 402 controlled by the second fuse set enable signal FUSE_EN1 is enabled. After the enabling of the first fuse set unit 401, the test control unit 410 may control other fuse set unit, not the second fuse set unit 402, to be enabled, or may control the plurality of fuse set units to be simultaneously enabled. That is, the enabling order and the simultaneous enabling number of the fuse set units 401 to 406 may be changed according to embodiments.

An internal operation of the first fuse set unit 401 when the first fuse set enable signal FUSE_EN0 is activated will be described as a representative example. In the normal mode, the internal operation of the first fuse set unit 401 is determined according to the cutting of the enable fuse of the enable fuse unit 41. However, when the first fuse set enable signal FUSE_EN0 is activated in the test mode, the signal combination unit 43 combines the comparison result signals HIT<0:N> to output the combination signal HITB<0>, without regard to the cutting of the enable fuse. Therefore, when the first fuse set enable signal FUSE_EN0 is activated, the first fuse set unit 401 compares the input addresses ADDR<0:N> with the internal programmed address to output the comparison result.

When all the address fuses of the first fuse set unit 401 are not cut, it can be considered that the programmed address is set to a predefined initial value. If the input addresses ADDR<0:N> are identical to the predefined initial value, the first fuse set unit 401 outputs the result that they are identical to each other. When the addresses ADDR<0:N> having a value other than the predefined initial value "0000 0000" are inputted, there may be situations where the first fuse set unit 401 outputs the result that they are identical to each other. In this case, since the predefined initial value is designed to be "0000 0000", it can be determined that the predefined initial value is initialized to the same value as the input addresses ADDR<0:N>. That is, when some of the address fuses are damaged or defective, they are initialized to a value other than the predefined initial value "0000 0000". For example, if the result that the input addresses ADDR<0:N>"0000 0001" is identical to the initial value is outputted, it can be determined that the address fuse corresponding to the lowest bit "1" is defective.

Therefore, the fuse set unit where the defective fuses exist can be detected by applying the addresses ADDR<0:N> to the fuse set units 401 to 406 that are sequentially enabled in the test mode. Furthermore, it can be detected which address fuse of the fuse set unit is defective.

Figure 5:
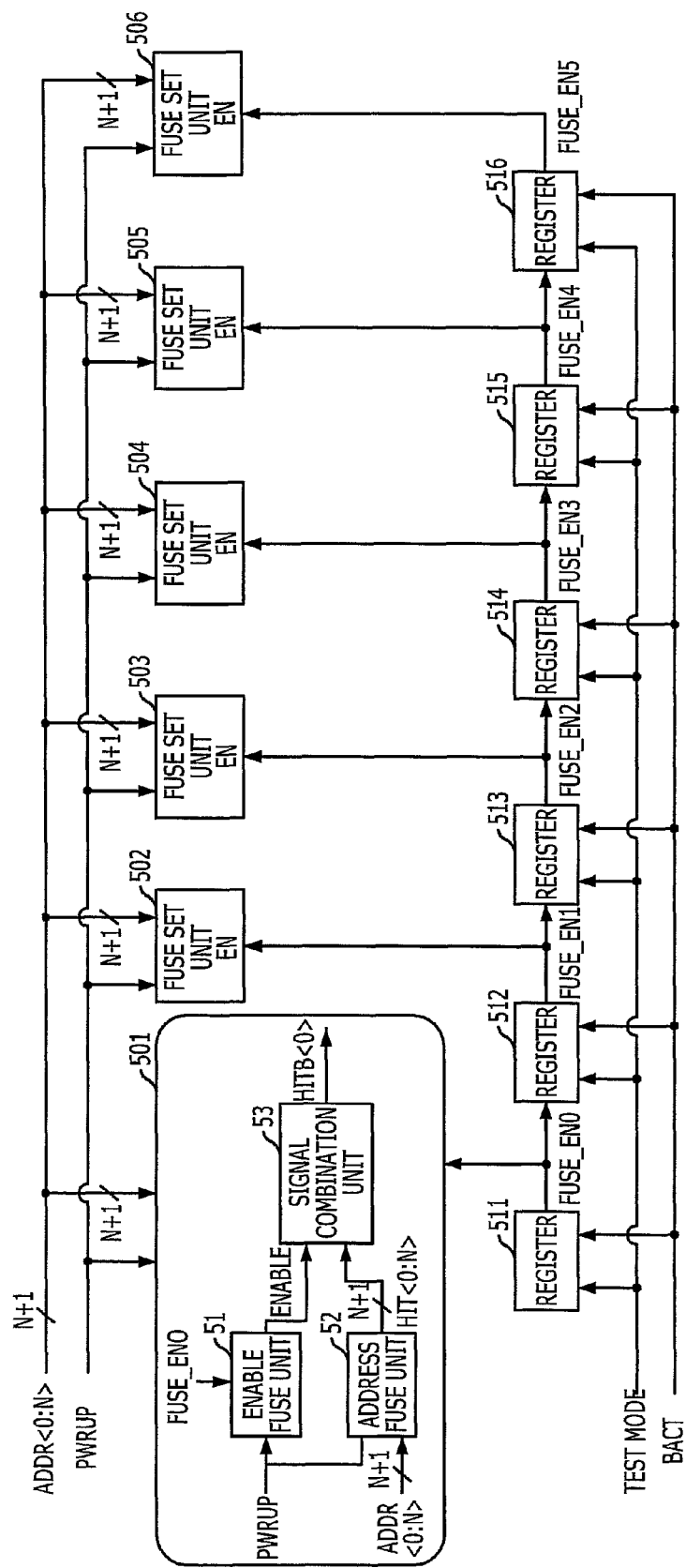
FIG. 5 is a block diagram of a fuse circuit of a semiconductor device in accordance with a second embodiment of the present invention.

FIG. 5 is a block diagram of a fuse circuit of a semiconductor device in accordance with a second embodiment of the present invention.

Referring to FIG. 5, the fuse circuit of the semiconductor device includes a plurality of fuse set units 501 to 506, and a shift register unit 511 to 516. The fuse set units 501 to 506 compare input addresses ADDR<0:N> with address information programmed according to fuse cutting states. The shift register unit 511 to 516 sequentially enables the fuse set units 501 to 506 in response to the selection signal BACT in a test mode.

A detailed structure and operation of the fuse circuit of FIG. 5 will be described below.

The fuse set units 501 to 506 can program address information through a fuse cutting process. Each of the fuse set units 501 to 506 includes an enable fuse unit 51, an address fuse unit 52, and a signal combination unit 53. The address fuse unit 52 compares address information programmed in a plurality of address fuses with address bit signals of input addresses ADDR<0:N> and outputs a plurality of comparison result signals HIT<0:N>. The signal combination unit 53 combines the comparison result signals HIT<0:N> under the control of the enable fuse unit 51 and outputs a combination signal HITB<0>. Meanwhile, the enable fuse unit 51 outputs an enable signal ENABLE corresponding to an electrical connection state of an enable fuse. The enable signal ENABLE is used to control the signal combination unit 53. That is, when the enable fuse is cut, the enable signal ENABLE is activated and the signal combination unit 53 combines the comparison result signals HIT<0:N> of the address fuse unit 52 to output the combination signal HITB<0>.

The shift register unit 511 to 516 includes a plurality of series-connected registers controlled by a test mode signal TEST_MODE and a selection signal BACT. Therefore, when the test mode signal TEST_MODE is activated in the test mode and the selection signal BACT is activated for the first time, the first register 511 activates the first fuse set enable signal FUSE_EN0. When the selection signal BACT is activated for the second time, the second register 512 activates the second fuse set enable signal FUSE_EN1. When the selection signal BACT is activated for the third time, the third register 513 activates the third fuse set enable signal FUSE_EN2. That is, whenever the selection signal BACT is activated, the series-connected registers 511 to 516 sequentially activate the corresponding fuse set enable signal FUSE_EN1.

An internal operation of the first fuse set unit 501 when the first fuse set enable signal FUSE_EN0 is activated will be described as a representative example. In the normal mode, the internal operation of the first fuse set unit 501 is determined according to the cutting of the enable fuse of the enable fuse unit 51. However, when the first fuse set enable signal FUSE_EN0 is activated in the test mode, the signal combination unit 53 combines the comparison result signals HIT<0:N> to output the combination signal HITB<0>, without regard to the cutting of the enable fuse. Therefore, when the first fuse set enable signal FUSE_EN0 is activated, the first fuse set unit 501 compares the input addresses ADDR<0:N> with the internal programmed address to output the comparison result.

When all the address fuses of the first fuse set unit 501 are not cut, it can be considered that the programmed address is set to a predefined initial value. If the input addresses ADDR<0:N> are identical to the predefined initial value, the first fuse set unit 501 outputs the result that they are identical to each other. When the addresses ADDR<0:N> having a value other than the predefined initial value "0000 0000" are inputted, there may be situations where the first fuse set unit 501 outputs the result that they are identical to each other. In this case, since the predefined initial value is designed to be "0000 0000", it can be determined that the first fuse set unit 501 is initialized to the same value as the input addresses ADDR<0:N>. That is, when some of the address fuses are damaged or defective, they are initialized to a value other than the predefined initial value "0000 0000". For example, if the result that the input addresses ADDR<0:N>"0000 0001" is identical to the value stored in the first fuse set unit 501 is outputted, it can be determined that the address fuse corresponding to the lowest bit "1" is defective.

Therefore, the fuse set unit where the defective fuses exist can be detected by applying the addresses ADDR<0:N> to the fuse set units 501 to 506 that are sequentially enabled in the test mode. Furthermore, it can be detected which address fuse of the fuse set unit is defective.

Figure 6:
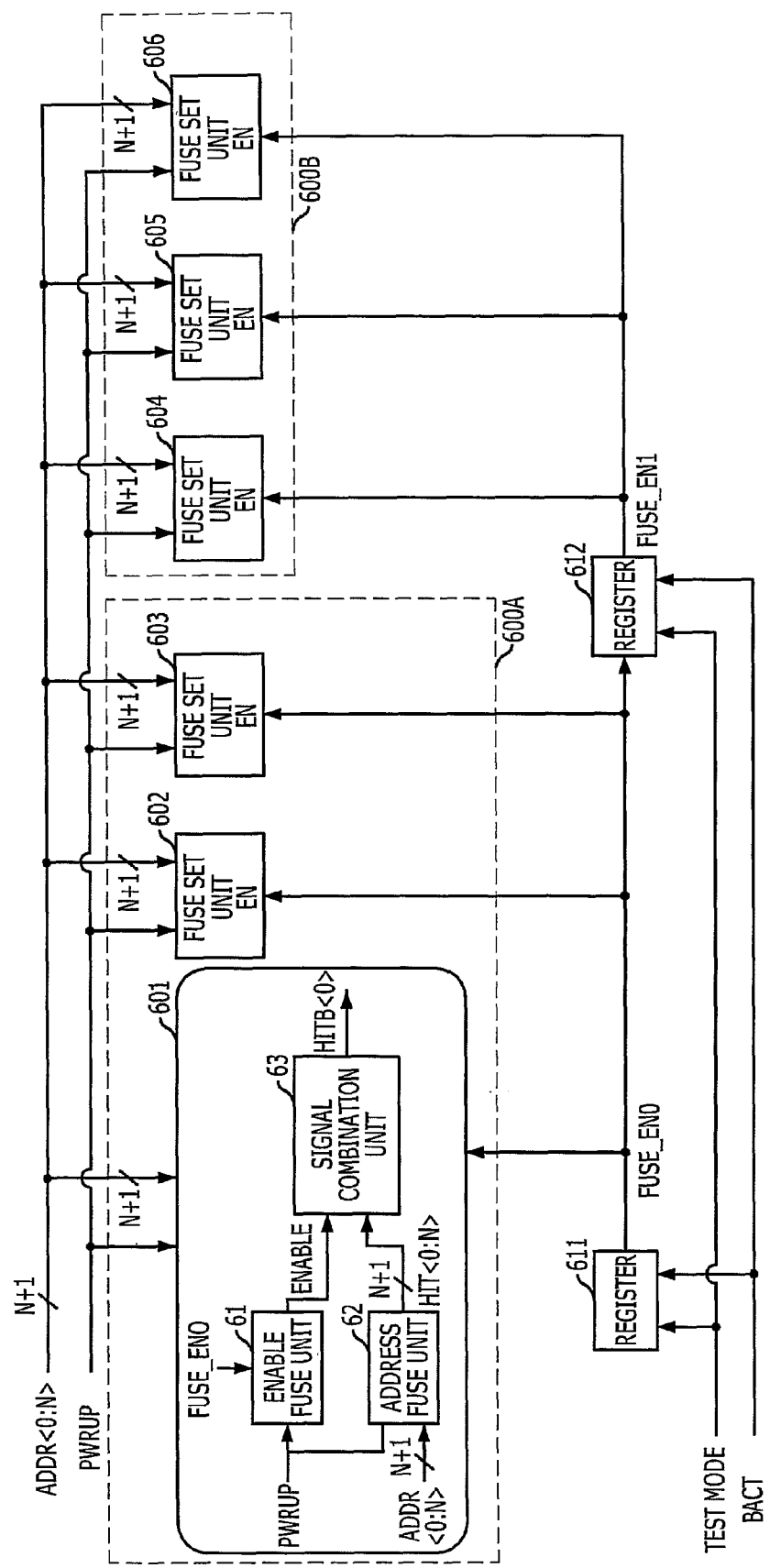
FIG. 6 is a block diagram of a fuse circuit of a semiconductor device in accordance with a third embodiment of the present invention.

FIG. 6 is a block diagram of a fuse circuit of a semiconductor device in accordance with a third embodiment of the present invention.

Referring to FIG. 6, the fuse circuit of the semiconductor device includes a plurality of fuse set groups 600A and 600B, and a shift register unit 611 and 612. The fuse set groups 600A and 600B each includes a predetermined number of fuse set units, and compares input addresses ADDR<0:N> with address information programmed according to fuse cutting states. The shift register unit 611 and 612 sequentially enables the fuse set groups 600A and 600B in response to the selection signal BACT in a test mode.

A detailed structure and operation of the fuse circuit of FIG. 6 will be described below.

The fuse set units 601 to 606 of the plurality of fuse set groups 600A and 600B can program address information through a fuse cutting process. Each of the fuse set units 601 to 606 includes an enable fuse unit 61, an address fuse unit 62, and a signal combination unit 63. The address fuse unit 62 compares address information programmed in a plurality of address fuses with address bit signals of input addresses ADDR<0:N> and outputs a plurality of comparison result signals HIT<0:N>. The signal combination unit 63 combines the comparison result signals HIT<0:N> under the control of the enable fuse unit 61 and outputs a combination signal HITB<0>. Meanwhile, the enable fuse unit 61 outputs an enable signal ENABLE corresponding to an electrical connection state of an enable fuse. The enable signal ENABLE is used to control the signal combination unit 63. That is, when the enable fuse is cut, the enable signal ENABLE is activated and the signal combination unit 63 combines the comparison result signals HIT<0:N> of the address fuse unit 62 to output the combination signal HITB<0>.

The shift register unit 611 and 612 includes a plurality of series-connected registers controlled by a test mode signal TEST_MODE and a selection signal BACT. Therefore, when the test mode signal TEST_MODE is activated in the test mode and the selection signal BACT is activated for the first time, the first register 611 activates the first fuse set enable signal FUSE_EN0. When the selection signal BACT is activated for the second time, the second register 612 activates the second fuse set enable signal FUSE_EN1. That is, whenever the selection signal BACT is activated, the series-connected registers 611 and 612 sequentially activate the corresponding fuse set enable signal FUSE_EN1.

An internal operation of the first fuse set unit 601 when the first fuse set enable signal FUSE_EN0 is activated will be described as a representative example. In the normal mode, the internal operation of the first fuse set unit 601 is determined according to the cutting of the enable fuse of the enable fuse unit 61. However, when the first fuse set enable signal FUSE_EN0 is activated in the test mode, the signal combination unit 63 combines the comparison result signals HIT<0:N> to output the combination signal HITB<0>, without regard to the cutting of the enable fuse. Therefore, when the first fuse set enable signal FUSE_EN0 is activated, the first fuse set unit 601 compares the input addresses ADDR<0:N> with the internal programmed address to output the comparison result.

When all the address fuses of the first fuse set unit 601 are not cut, it can be considered that the programmed address is set to a predefined initial value. If the input addresses ADDR<0:N> are identical to the predefined initial value, the first fuse set unit 601 outputs the result that they are identical to each other. When the addresses ADDR<0:N> having a value other than the predefined initial value "0000 0000" are inputted, there may be situations where the first fuse set unit 601 outputs the result that they are identical to each other. In this case, since the predefined initial value is designed to be "0000 0000", it can be determined that the first fuse set unit 601 is initialized to the same value as the input addresses ADDR<0:N>. That is, when some of the address fuses are damaged or defective, they are initialized to a value other than the predefined initial value "0000 0000". For example, if the result that the input addresses ADDR<0:N>"0000 0001" is identical to the value stored in the first fuse set unit 601 is outputted, it can be determined that the address fuse corresponding to the lowest bit "1" is defective.

Therefore, the fuse set group where the defective fuses exist can be detected by applying the addresses ADDR<0:N> to the fuse set groups 600A and 600B that are sequentially enabled in the test mode. The fuse circuit in accordance with the third embodiment of the present invention is enabled in the test mode on the basis of fuse set groups. Thus, it is impossible to detect which fuse set unit the defective fuse exists among the plurality of fuse set units included in the fuse set group. However, the size of the shift register unit 611 and 612 is relatively small and the test operation can be performed relatively faster.

Figure 7:
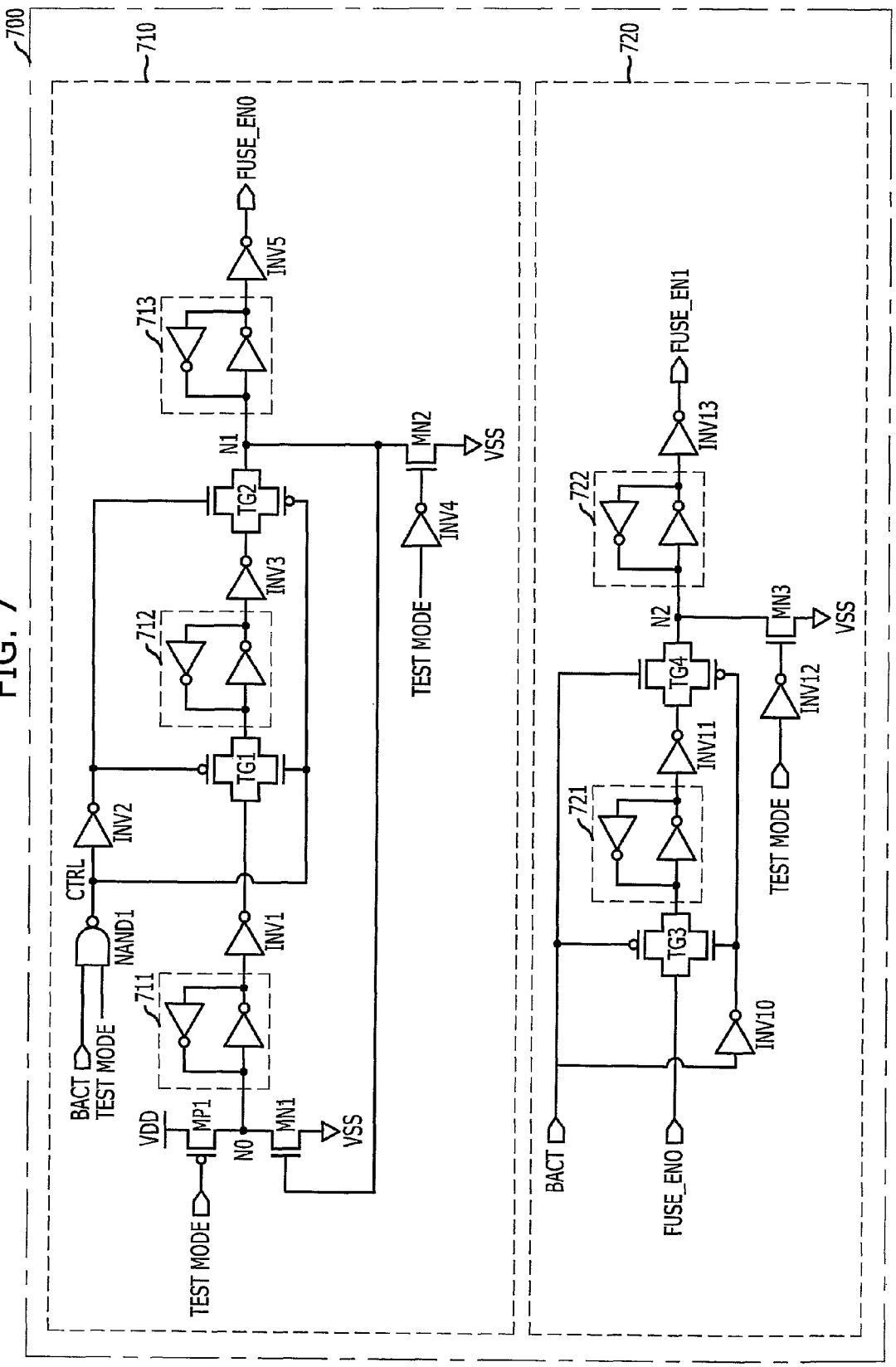
FIG. 7 is a circuit diagram of a shift register unit in accordance with an embodiment of the present invention.

FIG. 7 is a circuit diagram of the shift register unit in accordance with an embodiment of the present invention.

Referring to FIG. 7, the shift register unit 700 includes a first register 710 and a second register 720. The first register 710 generates the first fuse set enable signal FUSE_EN0 in response to the selection signal BACT and the test mode signal TEST_MODE. The second register 720 receives an output signal of the first register 710 to generate the second fuse set enable signal FUSE_EN1 in response to the selection signal BACT and the test mode signal TEST_MODE.

The first register 710 outputs the first fuse set enable signal FUSE_EN0 of a high level when the selection signal BACT is activated to a high level at the first time. Then, the first register 710 outputs the second fuse set enable signal FUSE_EN1 of a low level when the selection signal BACT is activated to a high level at the second time. The second register 720 outputs the second fuse set enable signal FUSE_EN1 of a low level as an initial value. The second register 720 continuously outputs the second fuse set enable signal FUSE_EN1 of a low level when the selection signal BACT is activated to a high level at the first time, and then outputs the second fuse set enable signal FUSE_EN1 of a high level when the second signal BACT is activated for the second time.

That is, the shift register unit 700 transfers a high-level pulse signal generated from the first register 710 to the register connected thereto whenever the selection signal BACT is activated. Although two registers 710 and 720 are exemplified in this embodiment, the shift register unit 700 may also be implemented with a plurality of shift registers having the same configuration as the second register 720.

A detailed description and operation of the shift register unit 700 will be described below.

First, the internal operation of the first register 710 will be described.

When the test mode signal TEST_MODE is at a low level, a first node N0 is pulled up by a PMOS transistor MP1 so that it maintains a high level. A first latch 711 stores a data of the first node N0. In this case, since a first transmission gate TG1 receiving an output signal of the first latch 711 is turned on, data outputted from the first transmission gate TG1 is again stored in a second latch 712. Since the second transmission gate TG2 receiving an output signal of the second latch 712 is turned off, it does not transfer the data any more. Since an output terminal of the second transmission gate TG2, that is, a second node N1, is pulled down by an NMOS transistor MN2, it is maintained at a low level. A third latch 713 stores a data of the second node N2 and finally outputs the first fuse set enable signal FUSE_EN0 of a low level.

When the test mode signal TEST_MODE becomes a high level, the pulling-down of the second node N1 is stopped. When the selection signal BACT switches to a high level pulse, the second transmission gate TG2 is turned on to output the high level data stored in the second latch 712 to the second node N1. In this case, the third latch 713 stores the data of the second node N1 and finally outputs the first fuse set enable signal FUSE_EN0 of a high level. Also, since the second node N1 becomes a high level, the first node N0 is pulled down by the NMOS transistor MN1, and the first latch 711 stores a low-level data of the first node N0. When the high level pulse of the selection signal BACT is over and changes to a low level, the first transmission gate TG1 is turned on and thus the data of the first latch 711 is again transferred to the second latch 712. Then, when the selection signal BACT switches again to a high level pulse, the data stored in the second latch 712 is finally outputted and thus the first fuse set enable signal FUSE_EN0 of a low level is outputted.

The internal operation of the second register 720 will be described below.

When the test mode signal TEST_MODE is at a low level, a third transmission gate TG3 is turned on and a fourth transmission gate TG4 is turned off. Thus, a fourth latch 721 stores an output signal of the third transmission gate TG3. Since the signal inputted to the third transmission gate TG3 is the output signal of the first register 710, a low level signal is stored in the fourth latch 721. Since an output terminal of the fourth transmission gate TG4, that is, a third node N2, is pulled down by an NMOS transistor MN3, it is maintained at a low level. The fifth latch 722 stores a data of the third node N2 and finally outputs the second fuse set enable signal FUSE_EN1 of a low level.

When the test mode signal TEST_MODE becomes a high level, the pulling-down of the third node N2 is stopped. When the selection signal BACT switches to a high level, the fourth transmission gate TG4 is turned on to output the low level data stored in the fourth latch 721. In this case, the fifth latch 722 stores the low level data and finally outputs the second fuse set enable signal FUSE_EN1 of a low level. Then, when the selection signal BACT is again pulsed to a high level, the data stored in the fourth latch 721 is finally outputted through the fourth transmission gate TG4 and the fifth latch 722. In this case, since the fourth latch 721 stores the high level data transferred from the first register 710, the second fuse set enable signal FUSE_EN1 of a high level is outputted. That is, the second register 720 outputs the data of the fourth latch 721, which stores the output signal of the first register 710, whenever the selection signal BACT switches to a high level.

Figure 8:
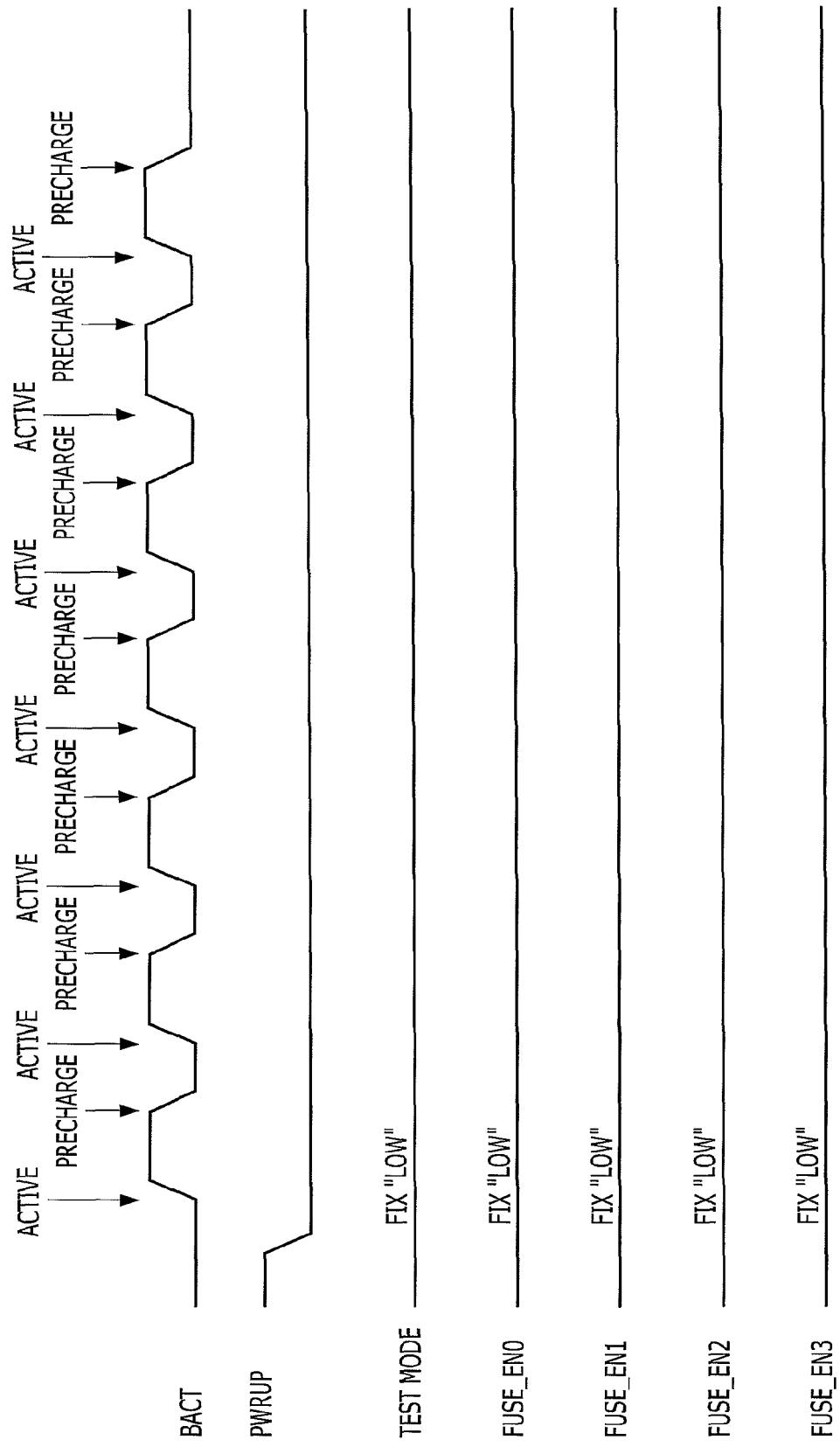
FIG. 8 is a first timing diagram explaining the internal operation of the fuse circuit of the semiconductor device in accordance with an embodiment of the present invention.

FIG. 8 is a first timing diagram explaining the internal operation of the fuse circuit of the semiconductor device in accordance with an embodiment of the present invention.

Referring to FIG. 8, since the test mode signal TEST_MODE is deactivated to a low level, the plurality of fuse set enable signals FUSE_EN0 to FUSE_EN3 are all maintained at a low level, without regard to the pulsing of the selection signal BACT.

Figure 9:
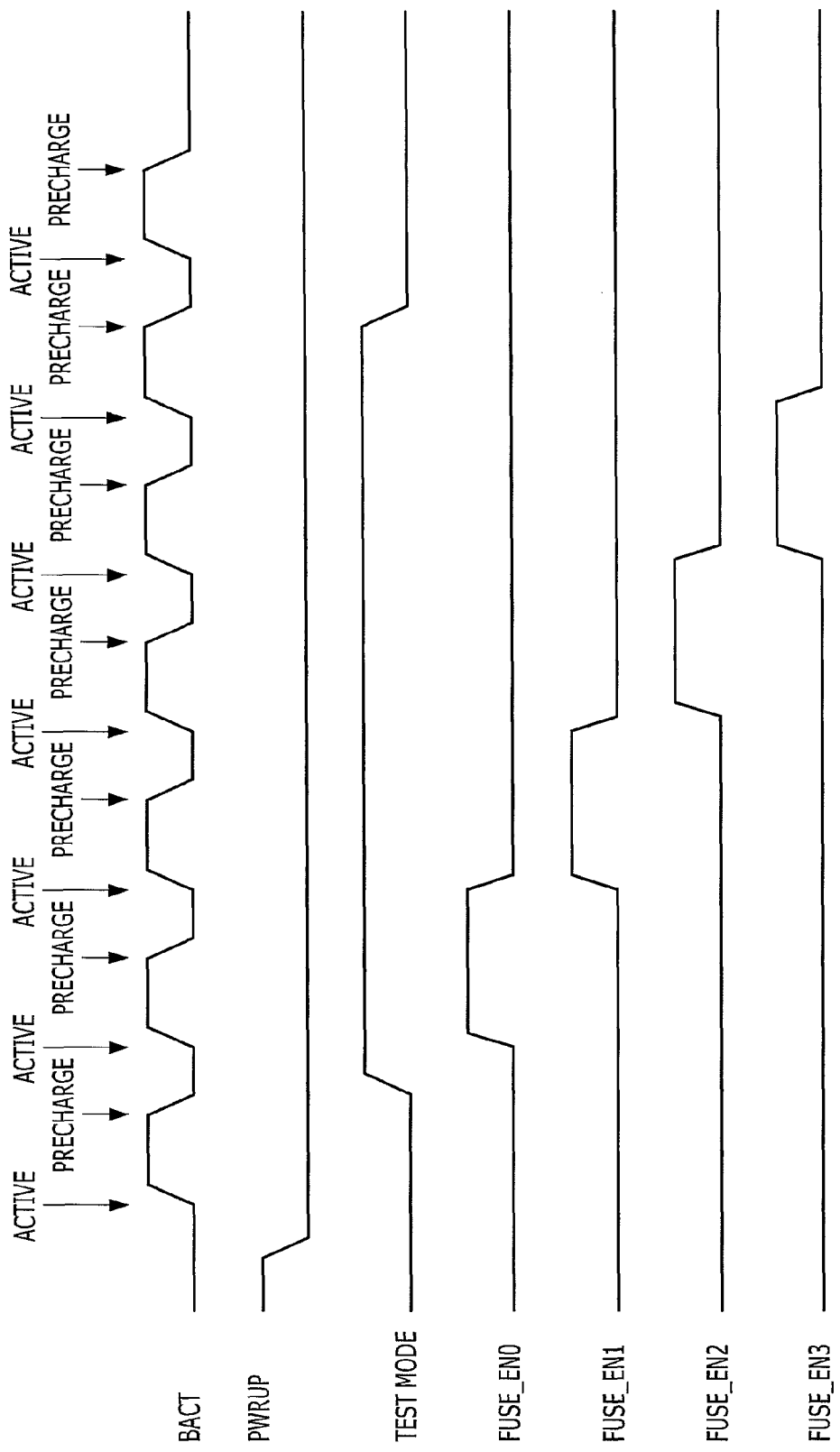
FIG. 9 is a second timing diagram explaining the internal operation of the fuse circuit of the semiconductor device in accordance with an embodiment of the present invention.

FIG. 9 is a second timing diagram explaining the internal operation of the fuse circuit of the semiconductor device in accordance with an embodiment of the present invention.

Referring to FIG. 9, when the test mode signal TEST_MODE is activated to a high level, that is, the semiconductor device operates in the test mode, the plurality of fuse set enable signals FUSE_EN0 to FUSE_EN3 are selectively activated based on a number of times that the selection signal BACT is enabled. In this embodiment, since the fuse circuit is included in the memory device, the active signal BACT is used as the selection signal. Therefore, the plurality of fuse set enable signals FUSE_EN0 to FUSE_EN3 are selectively activated according to the number of high-level activation of the active signal BACT. That is, when the active signal BACT is activated for the first time, the first fuse set enable signal FUSE_EN0 is activated to a high level. When the active signal BACT is activated for the second time, the second fuse set enable signal FUSE_EN1 is activated to a high level. Also, when the active signal BACT is activated for the fourth time, the fourth fuse set enable signal FUSE_EN3 is activated to a high level.

As described above, the fuse states of the fuse set units for comparing the input addresses with the address information programmed according to the fuse cutting states can be monitored by enabling the first fuse set during the first activation period of the selection signal BACT, sequentially inputting the test addresses to the enabled first fuse set unit to compare the programmed first address information (an initial value when the fuse cutting is not performed) with the test addresses, enabling the second fuse set unit during the second activation period of the selection signal BACT, and sequentially inputting the test addresses to the enabled second fuse set units to compare the programmed second address information (an initial value when the fuse cutting is not performed) with the test addresses.

In accordance with the embodiments of the present invention, the semiconductor device detects the fuse set unit having the defective fuse and limits the use of the corresponding fuse set unit, thereby preventing malfunction caused by the defects of the fuse circuit.

While the present invention has been described with respect to the specific embodiments, it will be apparent to those skilled in the art that various changes and modifications may be made without departing from the spirit and scope of the invention as defined in the following claims.

For example, although not directly related to the technical spirit of the present invention, embodiments including additional structures may be exemplified for further detailed description. Furthermore, the active high or active low structure representing the activation states of signals or circuits may be changed according to embodiments. Moreover, the configurations of the transistors may also be changed in order to implement the same functions. That is, the PMOS transistor and the NMOS transistor may be exchanged with each other and, if necessary, a variety of transistors may be used herein. Moreover, modifications can be made in the logic gate configurations in order to implement the same functions. That is, NAND units and NOR units may be implemented with various combinations of NAND gates, NOR gates, and inverters.

In particular, the number of fuse set units controlled simultaneously by a single register may be changed in accordance with embodiments. Since the selection signal used herein is a signal that selectively enables the fuse set units, the circuit may be implemented by allocating an internal signal or a control signal of the semiconductor device as the selection signal. Numerous modifications can be made in the circuit configuration and can be easily deduced by those skilled in the art. Therefore, their enumeration will be omitted herein.

What is claimed is:

1. A fuse circuit of a semiconductor device, the fuse circuit comprising:
   a plurality of fuse set units configured to compare an input address with address information programmed according to a fuse cutting state; and
   a test control unit configured to enable one or more fuse set units selected based on a number of times that a selection signal is enabled in a test mode,
   wherein the test control unit sequentially enables a plurality of fuse set groups, each fuse set group including a plurality of fuse set units, in response to the selection signal in the test mode, and
   wherein all fuse set units of the same fuse set group are enabled at the same time,
   wherein each of the plurality of fuse set units comprises:
      an enable fuse unit configured to output an enable signal corresponding to an electrical connection state of an enable fuse;
      an address fuse unit configured to have a plurality of address fuses, and compare the address information programmed in the plurality of address fuses with address bit signals of the input address; and
      a signal combination unit configured to combine a plurality of comparison result signals outputted from the address fuse unit in response to the enable signal.

2. The fuse circuit of claim 1, wherein the test control unit comprises a shift register unit configured to sequentially enable the plurality of fuse set groups in response to the selection signal in the test mode.

3. The fuse circuit of claim 2, wherein the shift register unit enables the fuse set groups selected according to the number of the activation of the selection signal.

4. The fuse circuit of claim 2, wherein the shift register unit comprises a plurality of registers connected in series and controlled by a test mode signal and the selection signal.

5. The fuse circuit of claim 2, wherein each of the plurality of fuse set units comprises:
   an enable fuse unit configured to output an enable signal corresponding to an electrical connection state of an enable fuse;
   an address fuse unit configured to have a plurality of address fuses, and compare the address information programmed in the plurality of address fuses with address bit signals of the input address; and
   a signal combination unit configured to combine a plurality of comparison result signals outputted from the address fuse unit in response to the enable signal.

* * * * *